US008842852B1

(12) United States Patent
Waller, Jr.

(10) Patent No.: US 8,842,852 B1
(45) Date of Patent: Sep. 23, 2014

(54) AUDIO DYNAMICS PROCESSING CONTROL SYSTEM WITH EXPONENTIAL RELEASE RESPONSE

(76) Inventor: James K. Waller, Jr., Clarkston, MI (US)

(*) Notice: Subject to any disclaimer, the term of this patent is extended or adjusted under 35 U.S.C. 154(b) by 440 days.

(21) Appl. No.: 13/136,294

(22) Filed: Jul. 28, 2011

(51) Int. Cl.
*H04B 15/00* (2006.01)
*H03G 3/00* (2006.01)

(52) U.S. Cl.
USPC .............. 381/94.1; 381/104; 381/106

(58) Field of Classification Search
None
See application file for complete search history.

(56) References Cited

U.S. PATENT DOCUMENTS

| 4,376,916 | A | * | 3/1983 | Glaberson .................. 330/136 |
| 4,696,044 | A | | 9/1987 | Waller, Jr. |
| 4,876,499 | A | * | 10/1989 | Anderson et al. ............ 323/312 |
| 4,881,047 | A | | 11/1989 | Waller, Jr. |
| 6,944,305 | B2 | | 9/2005 | Waller |
| 7,035,413 | B1 | | 4/2006 | Waller, Jr. et al. |
| 2006/0008096 | A1 | * | 1/2006 | Waller .......................... 381/106 |
| 2006/0233408 | A1 | | 10/2006 | Kates |
| 2008/0181439 | A1 | | 7/2008 | Neumann |

FOREIGN PATENT DOCUMENTS

JP        6164277 A     10/1994

* cited by examiner

*Primary Examiner* — Joseph Saunders, Jr.
*Assistant Examiner* — James Mooney
(74) *Attorney, Agent, or Firm* — Gable Gotwals (57) ABSTRACT

An input audio signal is detected to provide a fast time constant control signal which is clamped for immediate response when the input signal drops below a threshold level and filtered to provide a modified control signal with a slow time constant. As the modified control signal level decreases toward the control signal level, a time constant differential control signal decreases and slows the rate of change of the decreasing modified control signal which, as it nears the control signal level, reverts to a slow response. The resulting control signal has an exponential release response which can be applied to an audio dynamics processor. The time constant differential control signal may also be detected to provide an inverted output when it is significantly less than the modified control signal so as to result in the control signal also having an exponential attack response to be applied to the processor.

30 Claims, 5 Drawing Sheets

AUDIO DYNAMICS PROCESSING CONTROL SYSTEM WITH EXPONENTIAL RELEASE RESPONSE

BACKGROUND OF THE INVENTION

The present invention relates generally to audio dynamics processors such as compressor expanders, limiters and noise reduction systems and more particularly concerns audio processors in which the level or amplitude of an audio signal is dynamically altered in response to a generated voltage control signal.

Surround systems, such as disclosed in my U.S. Pat. No. 7,035,413, use numerous audio level detectors and generate control signals in response to a stereo input signal, but the subjective transparency of such surround systems can be greatly improved.

Below-threshold, expander-type noise gates have been commonly known and used for noise reduction in professional recording applications for many years. One of the most successful noise reduction systems for use with musical instruments, such as guitar, bass and keyboards, is a system commercially known as the HUSH® noise reduction system. The HUSH® system uses a combination of low-level downward expansion and dynamically controlled low-pass filtering.

The operation of the dynamically controlled low-pass filter portion of the HUSH® system is disclosed in my previous U.S. Pat. No. 4,696,044. When the HUSH® system is used to provide noise reduction for instruments such as guitar, the downward expander provides the most important and most audible aspect of the performance of the system. Conversely, when using the HUSH® system with composite music, the dynamic filters provide the most critical aspect of the operation of the system.

One of the most difficult applications for noise reduction is the removal or suppression of the noise that is present in high gain guitar systems. My U.S. Pat. No. 4,881,047 discloses a noise reduction system specifically designed to suppress the gain noise of a high-gain distortion circuit. The system disclosed in the '047 patent will also greatly reduce the amount of audible hum present in a high-gain guitar distortion system by reducing the gain of the preamplifier distortion circuit.

While the above disclosed systems and many of the previously available expander noise reduction systems have provided improvements in audio performance, they fall short of achieving optimal performance under all conditions. The prior art below-threshold expander systems typically provide a preset or, in some cases, user adjustable fixed slope release characteristic. In order to avoid audible distortion of the input signal or serious pumping side effects, it is desirable to have a slow release time constant for the control signal. When using a very fast time constant for the control voltage, excessive ripple in the control signal will modulate the VCA of a dynamics processor, thereby causing audible distortion, pumping or breathing. If the input signal contains low frequency components, a fast time constant can cause modulation of each cycle of the audio signal, thereby causing undesirable and, in some cases, very audible distortion.

While slowing the release time of an expander will improve the above mentioned side effects, a slow release time will also allow the noise floor to momentarily become audible when the input signal stops suddenly. This causes another objectionable side effect in the expander performance.

Making the release time dynamically variable as described in my U.S. Pat. No. 4,881,047 can offer improvements in expander performance. However, while this is an improvement over typical below threshold expanders, the above mentioned shortcomings remain in varying degrees.

While the teachings of the '047 patent are an improvement over the prior art, further improvements in performance have been made by clamping the control signal so that the release time begins at a predefined voltage level, typically at a point equal to the expander threshold, as is described in detail in my U.S. Pat. No. 6,944,305.

Audio expanders typically use some form of level detection that converts the input audio signal to a DC control signal. The generated control signal typically has a predefined release time constant characteristic. When the input level drops below a user adjustable threshold point, downward expansion will begin. The amount of expansion will increase as the input signal continues to drop further below the threshold point. In the prior art systems, the detection circuit will charge a timing capacitor well in excess of the predefined threshold point. The result is that, when the input signal stops abruptly, the prior art expander does not provide any reduction of the input signal until the timing capacitor voltage drops below the preset threshold point. This results in a "dead zone" where the control signal is decreasing but has no affect on the operation of the downward expander.

While the teachings of the '047 patent show one way to improve this problem, this design also suffers as a result of having a dead zone in the release response, a problem which is greatly improved in the teachings of the '305 patent. While the '305 patent teaches major improvements over prior art systems in generating a clamped threshold, dynamically variable attack and release response, the system still has one major shortcoming in that a large amount of ripple in the final control signal output can still cause audible audio modulation.

Considering the above, it is apparent that, while presently known solutions to audio distortion have been advancing the state of the art as to specific components of the overall problem, each advance is to some degree mitigated by a concomitant adverse effect on one or more of the other components, a two steps forward, one step back approach to audio distortion.

It is, therefore, an object of the present invention to provide an audio dynamics processing control signal which greatly reduces any audible modulation side effects in the audio signal. It is a further object of this invention to provide an audio dynamics processing control signal which reduces or eliminates the ripple in the fast time constant output in passing through to the final output control signal. And it is a further object of this invention to provide an audio dynamics processing control signal which minimizes or eliminates the introduction of adverse audio distortion effects to a system as an acceptable compromise.

SUMMARY OF THE INVENTION

In accordance with one embodiment of the invention, a process and circuit for conditioning an input audio signal is provided which produces a control signal having an exponential release response.

The input signal is level detected to provide a preferably logarithmic control signal with a fast time constant. During the level detection phase of the process, the control signal may optionally be filtered to reduce response ripple.

The control signal provided by level detection is filtered to provide a modified control signal with a slow time constant. Preferably, the control signal will be clamped prior to being filtered so as to be immediately responsive when the input signal drops below a threshold level.

The control signal and the modified control signal are compared to generate a time constant differential control signal and the time constant differential control signal is detected to provide a logarithmic output voltage when the time constant differential control signal is significantly greater than the modified control signal. Detection of the time constant differential control signal may be preceded by the imposition of an initial dead band response on the time constant differential control signal.

The logarithmic output voltage is converted into a release current having an exponential release response. Preferably, conversion of the logarithmic output voltage into a release current having an exponential response will be accomplished by applying the logarithmic output voltage to a pair of current mirror transistors.

As the modified control signal level decreases toward the control signal level, the time constant differential control signal decreases and slows the rate of change of the decreasing modified control signal. As the decreasing modified control signal level nears the control signal level, the decreasing modified control signal reverts to a slow response.

The release current is applied to control an audio dynamics processor.

In accordance with other embodiments of the invention, the time constant differential control signal may be detected to provide an inverted logarithmic output voltage when the time constant differential control signal is significantly less than the modified control signal, the inverted logarithmic output voltage converted into an attack current having an exponential attack response and the attack current applied to control an audio dynamics processor.

Detection of the time constant differential control signal to provide an inverted logarithmic output voltage may be preceded by the imposition of an initial dead band response on the time constant differential control signal. Conversion of the inverted logarithmic output voltage can be accomplished by applying the inverted logarithmic output voltage to a pair of current mirror transistors.

In operation, as the modified control signal level increases toward the control signal level, the time constant differential control signal decreases and slows the rate of change of the increasing modified control signal. As the increasing modified control signal level nears the control signal level, the increasing modified control signal reverts to a slow response.

BRIEF DESCRIPTION OF THE DRAWINGS

Other objects and advantages of the invention will become apparent upon reading the following detailed description and upon reference to the drawings in which.

While the invention will be described in connection with preferred embodiments thereof, it will be understood that it is not intended to limit the invention to those embodiments or to the details of the construction or arrangement of parts illustrated in the accompanying drawings.

DETAILED DESCRIPTION

Prior Art

Figure 1:
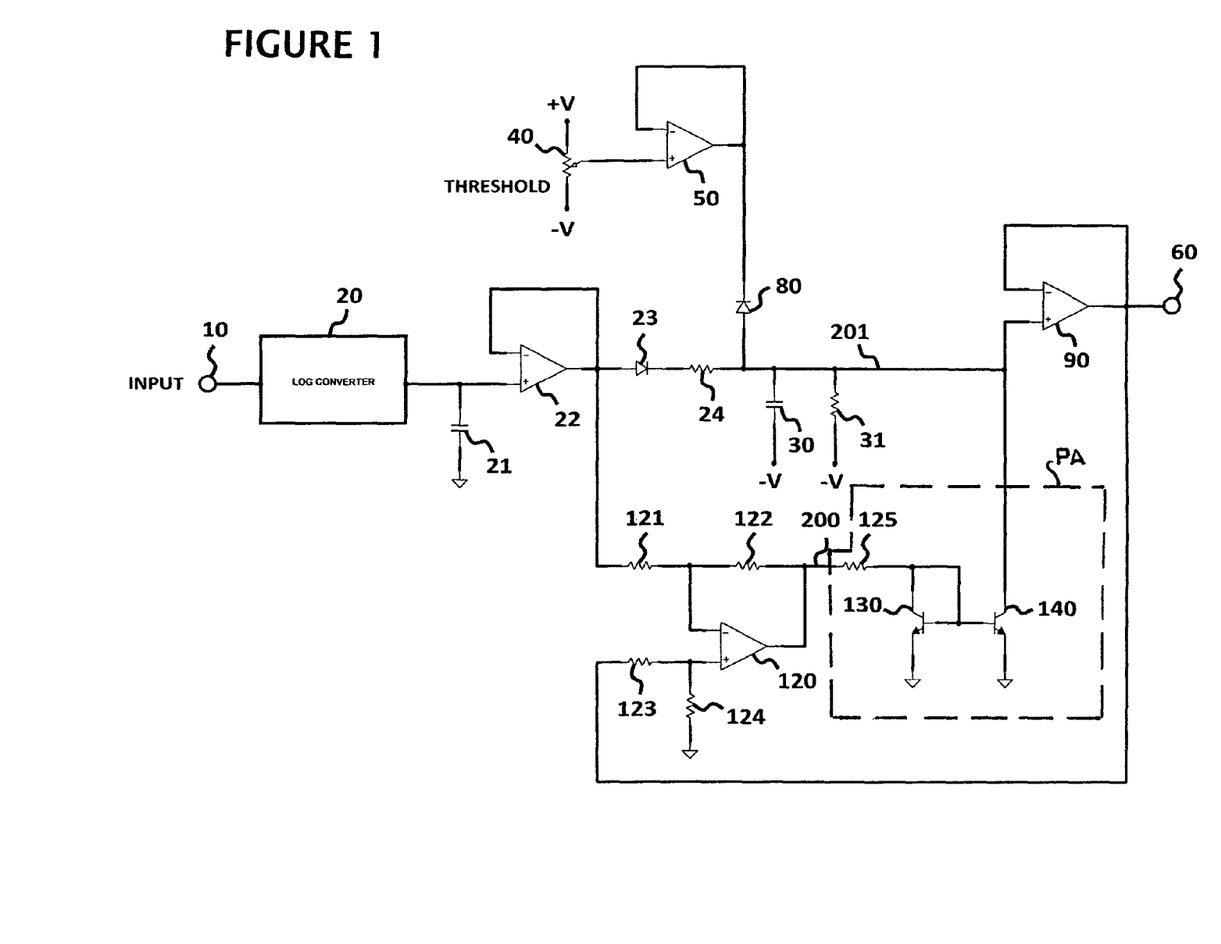
FIG. 1 is a schematic diagram of the prior art.
Figure 2:
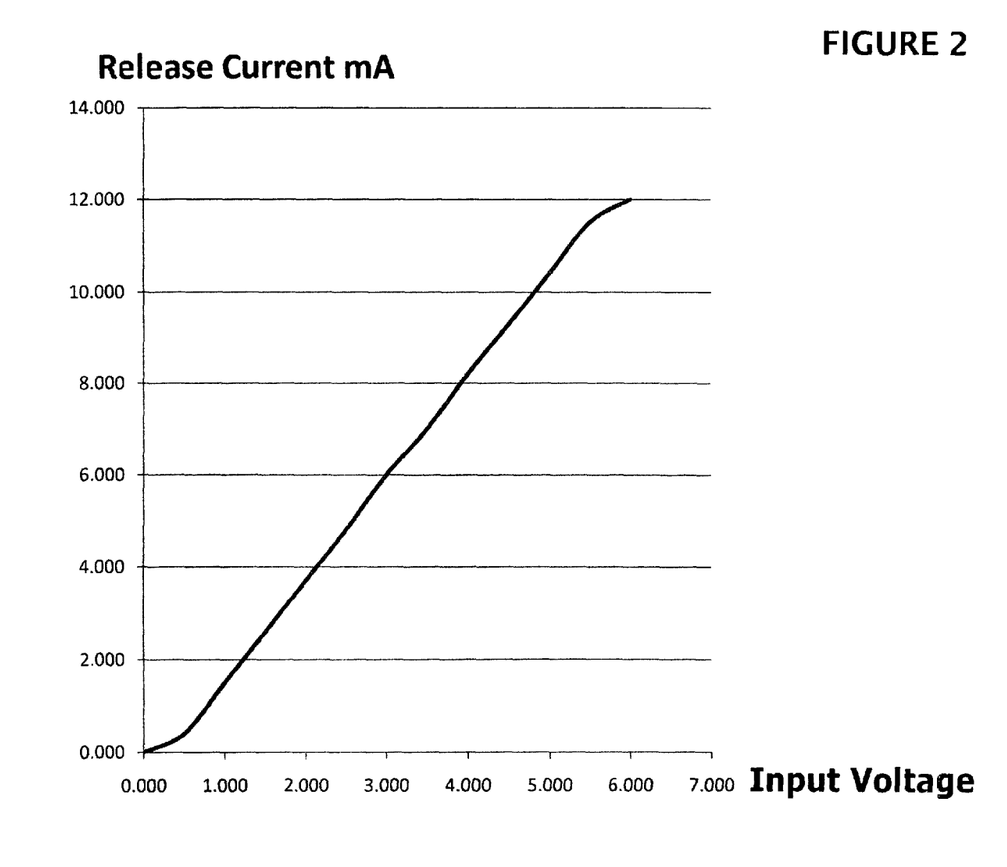
FIG. 2 is a graphical representation of the release response of the prior art.

A prior art differentially controlled, continuously variable control circuit, such as the system of the '305 patent is shown in FIG. 1. The prior art system of FIG. 1 provides a linear release response, as shown in FIG. 2.

As seen in FIG. 1, the audio signal is fed to the input 10 which feeds the input of a log detection circuit 20. The output of the log detector 20 is filtered by a capacitor 21 and buffered by a buffer amplifier 22. The output of the buffer amplifier 22, which provides a low output impedance to drive the remaining circuitry, feeds the anode side of a diode 23 and a resistor 121. The cathode side of the diode 23 is connected via a resistor 24 to a node 201 of the circuit which is connected through the cathode end of a clamping diode 80 to the output of a threshold buffer amplifier 50 and to a timing capacitor 30 which, together with the resistor 24, determines the attack time of the system. The node 201 of the circuit is also connected to another resistor 31, to the positive input of a buffer connected operational amplifier 90 and to the collector of an NPN transistor 140. The output of the operational amplifier 90 provides the final control signal output 60.

Depending on the desired application, additional circuitry may follow the output of the operational amplifier 90 to provide level shifting or other functions for the specific application. There are numerous modifications known in the art for shifting the final output operating voltage if required for a specific application.

Continuing in reference to FIG. 1, a typical value for the timing capacitor 30 and the resistor 31 may be 0.1 µf and 4.7 megΩ, respectively. The value of the filter capacitor 21 will typically be 0.1 µf, which will have a very fast attack and release response. This will allow the output of the buffer amplifier 22 to follow the short-term dynamic changes of the input signal, thus providing very fast attack and release. The above stated values for the timing capacitor 30 and the resistor 31 will provide a very large time constant. This means that the output of the operational amplifier 90 will have a very slow release.

The output of the operational amplifier 90 provides the output signal 60 and also feeds the positive input of a differential amplifier 120 via a resistor 123. Resistors 121, 122, 123, and 124 are all typically 20 kΩ, thus providing a unity gain differential amplifier.

Continuing to look at FIG. 1, the circuit block PA is connected between the previously mentioned nodes 200 and 201. The output of the differential amplifier 120 is fed via the first node 200 through a resistor 125 which is serially connected to a diode-connected first transistor 130. The emitter connection of the first transistor 130 is tied to ground. The common tied base and collector of the first transistor 130 are connected to the base of a second transistor 140 and the emitter of the second transistor 140 is also connected to circuit ground. The collector of the second transistor 140 is connected to the second node 201 that feeds the positive input of the buffer amplifier 90.

The transistors 130 and 140 form a current mirror that will vary the release time of the system. In operation, the differential amplifier 120 compares the difference between the output voltages of the buffer amplifier 22 and the operational amplifier 90. When the output of the operational amplifier 90 is positive with respect to the output of the buffer amplifier 22, a positive differential control signal will be present at the output of the difference amplifier 120. The current source transistor 140 will only sink current and thereby increase the release time of the system when there is a positive differential control signal present at the output of the difference amplifier 120.

When a large input signal is applied to the input 10, the output of the buffer amplifier 22 will produce a positive output voltage. Since the attack time at the output of the buffer amplifier 22 is considerably faster than the attack time that will be seen at the output of the operational amplifier 90, the voltage at the output of the buffer amplifier 22 will be more positive than the output of the operational amplifier 90. The timing capacitor 30 will charge up to a voltage equal to the predefined clamp point determined by the threshold circuit 40, 50, 80. Under this condition the output of the difference amplifier 120 will be negative with respect to circuit ground. When the output of the difference amplifier 120 is negative, there will be no current flowing into the diode connected transistor 130. Therefore, there will be no collector current flowing into the current source 140. When the input signal drops, the output voltage at the operational amplifier 90 will exceed the output voltage of the buffer amplifier 22. This means that the output of the difference amplifier 120 will become positive, creating a positive differential control signal which will cause current to flow into the current mirror transistors 130 and 140. The resistor 125 is relatively large, typically 3.3 megΩ. The voltage across the resistor 125 will provide an input current to feed the current mirror transistors 130 and 140. This will cause the current source transistor 140 to sink current. This will result in an increase in the release time of the system. If the input signal stops very abruptly, as would be the case with an input from a guitar playing staccato notes, the differential time constant control signal at the output of the differential amplifier 120 will become quite large. Under certain combinations of chords or sustained note combinations, a large amount of ripple can be created in the fast time constant control signal. This ripple will pass through to the final control signal causing modulation of the output signal causing objectionable distortion. Slowing down the fast time constant to help reduce this ripple will cause the fast release response to be slower than desirable with fast staccato notes.

Turning now to FIG. 2, a graphical representation of the release current vs. the input voltage at the first node 200 of the circuit of FIG. 1 is seen to be a very linear response with 1 volt of input voltage providing nearly 2 milliamps of release current and 4 volts of input voltage providing more than 8 milliamps of release current. It can also be seen from the graph of FIG. 2 that ripple of +/−1 volt at the fast time constant output of the buffer amplifier 22 of FIG. 1 can cause a large enough amount of release current in the slow time constant to produce ripple in the final control signal output. The side effect is that, even with a long sustained combination of notes with certain harmonic structures, an undesirable amount of ripple will pass to the output control signal 60 causing modulation of the VCA in the signal path causing distortion.

First Embodiment of the Invention

Figure 3:
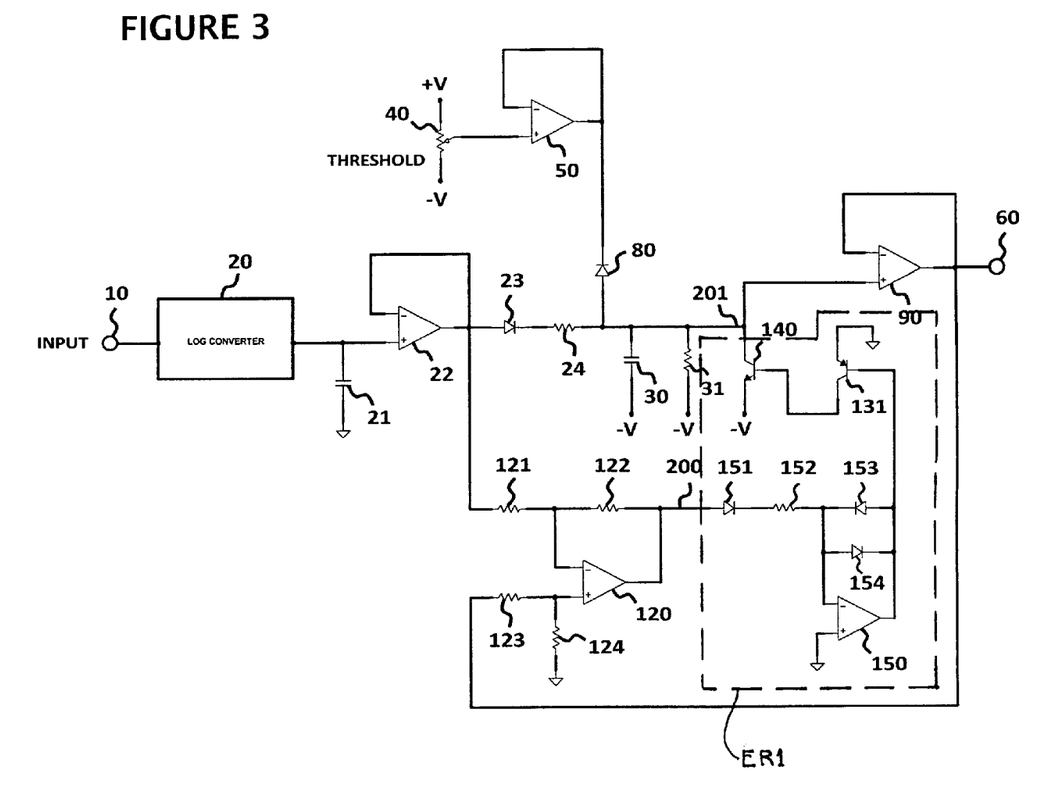
FIG. 3 is a schematic diagram of an exponential release embodiment of the invention.

Looking at FIG. 3, a preferred embodiment of the invention is shown using the element numbers of FIG. 1 for corresponding components of FIG. 3. The circuit block PA of the prior art circuit of FIG. 1 is replaced in FIG. 3 by a circuit block ER1 which is the exponential release response circuit of the invention and is connected between the nodes 200 and 201.

As seen in FIGS. 1 and 3, the first node 200 still receives the differential time constant correction signal from the output of the differential amplifier 120 However, in FIG. 3, the differential time constant correction signal is applied to the anode side of a diode 151. The cathode side of the diode 151 is connected to a resistor 152 which is serially connected to the negative input of an operational amplifier 150. The operational amplifier 150 has its positive input connected to ground and a pair of diodes 153 and 154 connected in parallel between its output and negative input. The output of the operational amplifier 150 is also connected to the base of a PNP transistor 131. The emitter of the transistor 131 is connected to ground and its collector is connected to the base of a current mirror transistor 140. The emitter of the current mirror transistor 140 is connected to the negative supply voltage and its collector becomes the current sink output at the second node 201, providing the release current for the circuit.

In operation, when the input voltage at the first node 200 goes positive by more than 0.6 volts, the diode 151 will start to conduct, providing a voltage at the collector and a positive voltage to the resistor 152. The operational amplifier 150, resistor 152 and diodes 153 and 154 operate as an inverting logarithmic converter. With the positive input voltage at the first node 200, the output of the log converter operational amplifier 150 goes negative, providing base current to the transistor 131. Since its emitter is connected to ground and the positive input of the operational amplifier 150 is ground referenced, the logged output voltage of the operational amplifier 150 can drive the base of the transistor 131 directly, providing an increasing collector current to the base of the current mirror transistor 140 and thus producing an increasing current sink providing the release current at the second node 201.

Figure 4:
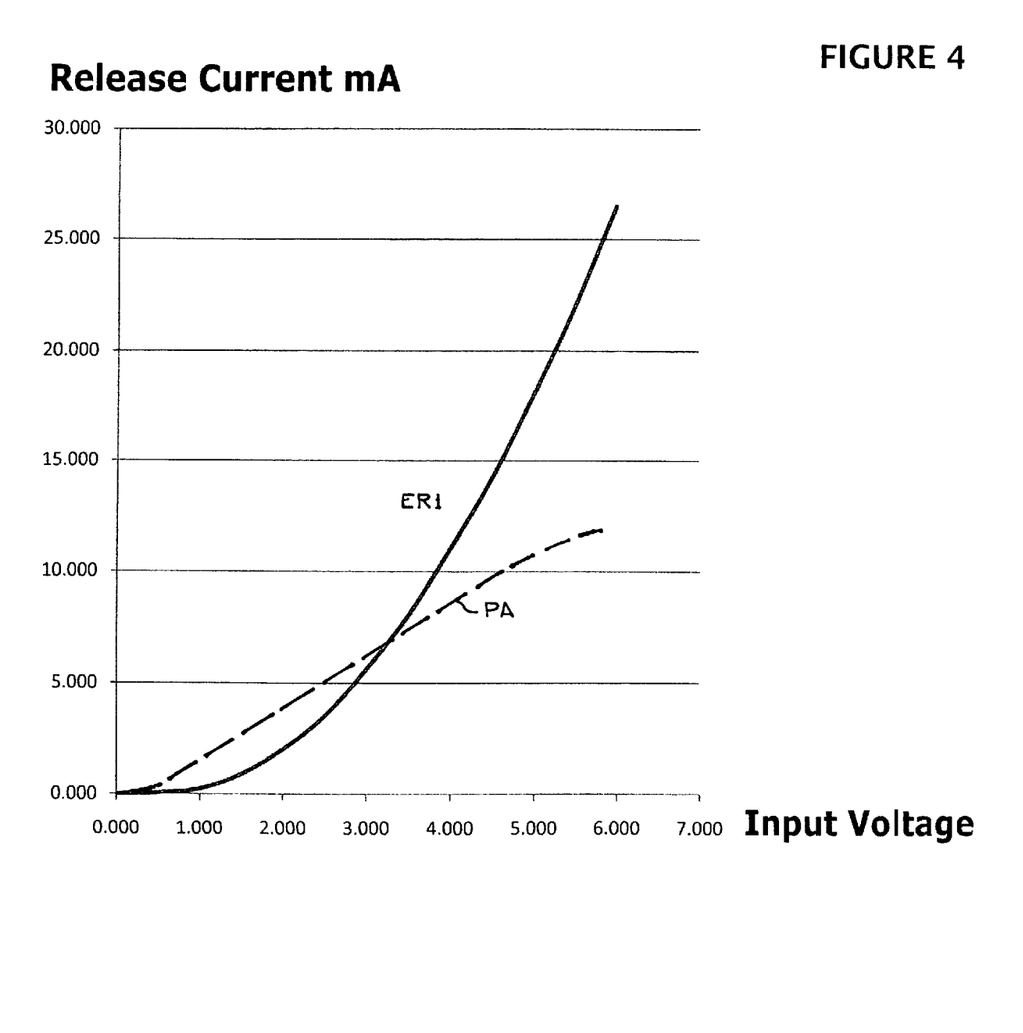
FIG. 4 is a graphical representation of the exponential release response of the invention compared to the prior art release response of FIG. 2.

FIG. 4 graphically illustrates, for the circuit of FIG. 3, the relationship between the input voltage at the first node 200 versus the release current at the second node 201. The input voltage at the first node 200 needs to exceed nearly 1 volt before any increase in release current is seen. This is due to both the dead band of the diode 151 and also due to the required VBE drop of the transistor 131. As the input voltage at the one node 200 increases above 1 volt, the output release current increases exponentially. By providing a nearly 1 volt dead band in the operation of the release circuit, the majority of the ripple that may appear in the fast release time constant will not be passed on in the final control voltage feeding the control port of the VCA.

Comparing the response curve PA of FIG. 2 which is superimposed on the response curve ER1 of FIG. 4, it can be seen that the improved exponential release circuit ER1 not only provides the helpful dead band but also provides an increased output release current as the input voltage at the first node 200 increases above 3 volts. It can also be seen that when the input voltage at the first node 200 increases above 4 volts the output current of the exponential circuit will exceed the prior art design and, between 4 and 6 volts, the exponential release circuit ER1 will actually double the available release current of the prior art circuit PA. This means that, in operation, when the difference between the fast time constant and the output control voltage is large, the differential control voltage will be large in excess of 4 volts providing a large amount of release current. This will cause a fast change in the time constant producing a rapid change in the final control voltage. As the output control voltage becomes close to that of the fast time constant, the time constant of the final output signal will become very long. Due to the dead band of the exponential release circuit, any ripple in the fast time constant of less than nearly 1 volts will not appear in the final output control signal 60 of the circuit of FIG. 3. In operation the dead band will not affect the actual fast release response of the system due to the fact that an instantaneous drop in the input signal would cause a large output voltage from the differential time constant control signal output at the first node 200 of FIG. 3. Since the release current seen at the second node 201 of FIG. 3 can be greater than in the prior art design, the fast release response remains extremely fast.

Second Embodiment of the Invention

Figure 5:
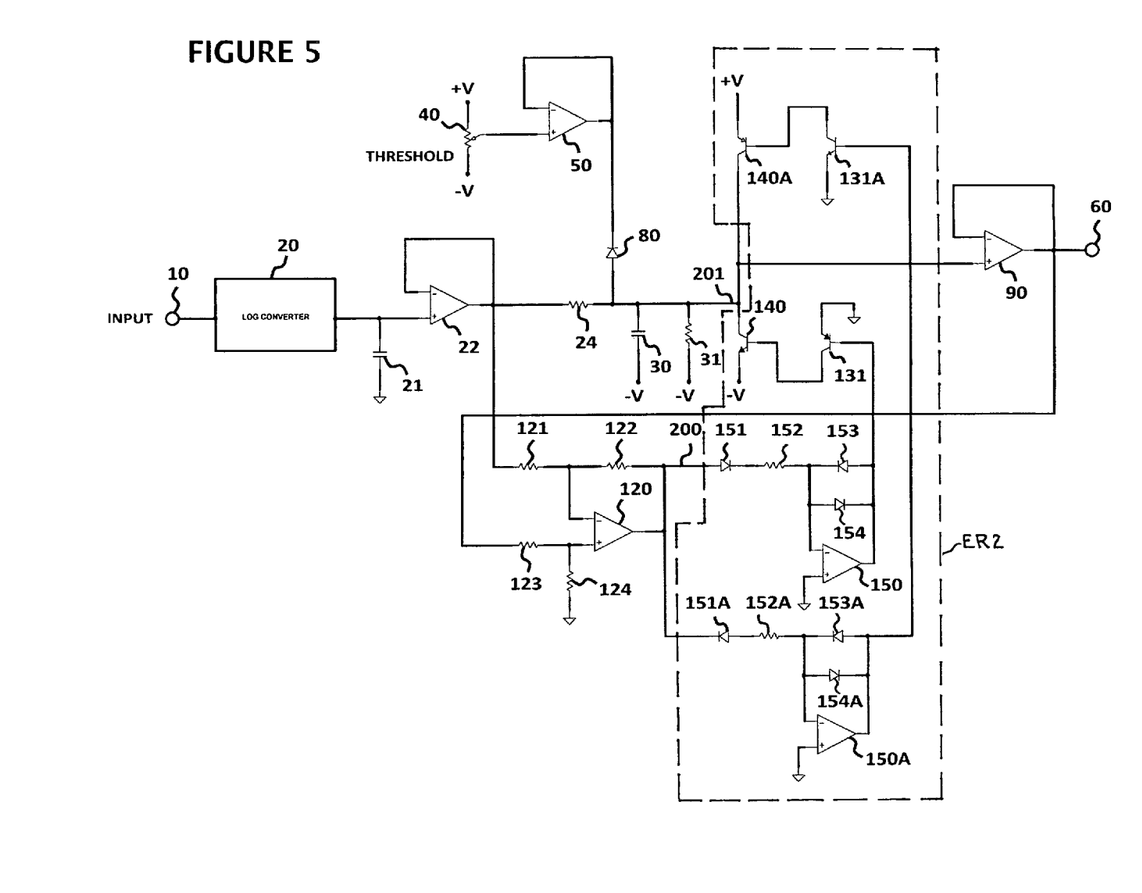
FIG. 5 is a schematic diagram of a symmetrical, differentially controlled, continuously variable exponential attack and exponential release embodiment of the invention.

Looking at FIG. 5, an example of a symmetrical, differentially controlled, continuously variable exponential attack and exponential release embodiment of the invention closely resembles the system disclosed in FIG. 3. However, in FIG. 5 the circuit block ER1 of FIG. 3 is replaced by the circuit block ER2.

The circuit block ER2 of FIG. 5 adds to the circuit block ER1 of FIG. 3 a second logging amplifier 150A and set of current mirror transistors 131A and 140A. The positive input of the differential amplifier 120 is connected to the output of the buffer amplifier 22 and the negative input is connected to the output of the operational amplifier 90. The components of FIG. 5 with identical element numbers as FIG. 3 perform identical operations and functions. Therefore, the following description of the FIG. 5 embodiment will deal specifically with the additional components and operation of this enhanced embodiment. If the output of the differential amplifier 120 is zero volts, the attack and release time of the system will be determined by the resistor 24 and the timing capacitor 30. If the output voltage at the differential amplifier 120 goes negative, the logging amplifier 150A output will go positive. The diode 151A will become forward biased once the output voltage of the differential amplifier 120 goes negative by more than 0.6 volts. A resistor 152A is connected between the diode 151A and the negative input of the logging amplifier 150A and parallel diodes 153A and 154A operate in the feedback loop of the logging amplifier 150A providing the logarithm of the input voltage. A positive output from the logging amplifier 150A will provide base current in the mirror transistor 131A, which will then provide base current in associated transistor 140A, producing charging current at the second node 201 and providing an exponential dynamic attack response at the operational amplifier output 60. The charging current of the current mirror transistor 140A will have the same response characteristic as shown in FIG. 4 except that it will be charging or attack time current as opposed to release current. The net result is that the system will be far more immune to ripple signals that could otherwise pass through to the final VCA output control signal 60, but with very fast attack and release response to large dynamic input changes.

The advantages of the embodiment shown in FIG. 5 of the invention can be applied to controlling adaptive compressors and also applied to many other applications including surround systems such as is disclosed in my U.S. Pat. No. 7,035,413 entitled "DYNAMIC SPECTRAL MATRIX SURROUND SYSTEM". In a surround system, it is desirable to provide fast response time for quickly changing directional signals while avoiding noticeable image wandering or distortion of the audio signal as a result of a fast release time in the system. The present invention can be applied to surround matrix steering systems providing a major improvement over previous methods of controlling the steering response time.

It is understood that all of the above disclosed aspects of the invention can also be realized by use of Digital Signal Processing techniques. Specific algorithms incorporating some or all aspects of the invention are clearly anticipated.

Thus, it is apparent that there has been provided, in accordance with the invention, an improved audio dynamics processing control system with an exponential release response that fully satisfies the objects, aims and advantages set forth above. While the invention has been described in conjunction with specific embodiments thereof, it is evident that many alternatives, modifications and variations will be apparent to those skilled in the art and in light of the foregoing description. Accordingly, it is intended to embrace all such alternatives, modifications and variations as fall within the spirit of the appended claims.

What is claimed is:

1. A process for conditioning an input audio signal comprising the steps of:
    level detecting the input signal to provide a control signal having a fast time constant;
    filtering the control signal to provide a modified control signal having a slow time constant;
    comparing the control signal and the modified control signal to generate a time constant differential control signal;
    detecting the time constant differential control signal to provide a logarithmic output voltage when the time constant differential control signal is significantly greater than the modified control signal; and
    converting the logarithmic output voltage into a release current having an exponential release response.

2. A process according to claim 1 further comprising the step of applying the release current to control an audio dynamics processor.

3. A process according to claim 1, said step of level detecting providing a logarithmic control signal.

4. A process according to claim 3, said step of level detecting further comprising the step of filtering the logarithmic control signal to provide the control signal.

5. A process according to claim 1 further comprising the step of clamping the control signal to be immediately responsive when the input signal drops below a threshold level.

6. A process according to claim 1, said step of detecting the time constant differential control signal being preceded by the step of imposing an initial dead band response on the time constant differential control signal.

7. A process according to claim 1, said step of converting the logarithmic output voltage comprising applying the logarithmic output voltage to a pair of current mirror transistors.

8. A process according to claim 1 whereby, as the modified control signal level decreases toward the control signal level, the time constant differential control signal decreases and slows the rate of change of the decreasing modified control signal.

9. A process according to claim 8 whereby, as the decreasing modified control signal level nears the control signal level, the decreasing modified control signal reverts to a slow response.

10. A process according to claim 1 further comprising the steps of:
    detecting the time constant differential control signal to provide an inverted logarithmic output voltage when the time constant differential control signal is significantly less than the modified control signal; and
    converting the inverted logarithmic output voltage into an attack current having an exponential attack response.

11. A process according to claim 10 further comprising the step of applying the attack current to control an audio dynamics processor.

12. A process according to claim 10, said step of detecting the time constant differential control signal to provide an inverted logarithmic output voltage being preceded by the step of imposing an initial dead band response on the time constant differential control signal.

13. A process according to claim 10, said step of converting the inverted logarithmic output voltage comprising applying the inverted logarithmic output voltage to a pair of current mirror transistors.

14. A process according to claim 10 whereby, as the modified control signal level increases toward the control signal level, the time constant differential control signal decreases and slows the rate of change of the increasing modified control signal.

15. A process according to claim 14 whereby, as the increasing modified control signal level nears the control signal level, the increasing modified control signal reverts to a slow response.

16. For conditioning an input audio signal, a circuit comprising:
   means for level detecting the input signal to provide a control signal having a fast time constant;
   means for filtering said control signal to provide a modified control signal having a slow time constant;
   means for comparing said control signal and said modified control signal to generate a time constant differential control signal;
   means for detecting said time constant differential control signal to provide a logarithmic output voltage when said time constant differential control signal is significantly greater than said modified control signal; and
   means for converting said logarithmic output voltage into a release current having an exponential release response.

17. A circuit according to claim 16 further comprising means for applying said release current to control an audio dynamics processor.

18. A circuit according to claim 16, said means for level detecting comprising a log converter.

19. A circuit according to claim 18 further comprising means for filtering an output of said log converter to provide said control signal.

20. A circuit according to claim 16 further comprising means for clamping said control signal to be immediately responsive when the input signal drops below a threshold level.

21. A circuit according to claim 16, said means for detecting said time constant differential control signal further comprising means for imposing an initial dead band response on said time constant differential control signal.

22. A circuit according to claim 16, said means for converting said logarithmic output voltage comprising a pair of current mirror transistors.

23. A circuit according to claim 16 whereby, as a level of said modified control signal decreases toward a level of said control signal, said time constant differential control signal decreases and slows a rate of change of said decreasing modified control signal.

24. A circuit according to claim 23 whereby, as said decreasing modified control signal level nears said control signal level, said decreasing modified control signal reverts to a slow response.

25. A circuit according to claim 16 further comprising:
   means for detecting the time constant differential control signal to provide an inverted logarithmic output voltage when said time constant differential control signal is significantly less than said modified control signal; and
   means for converting said inverted logarithmic output voltage into an attack current having an exponential attack response.

26. A circuit according to claim 25 further comprising means for applying said attack current to control an audio dynamics processor.

27. A circuit according to claim 25, said means for detecting said time constant differential control signal further comprising means for imposing an initial dead band response on said time constant differential control signal.

28. A circuit according to claim 27, said means for converting said inverted logarithmic output voltage comprising a pair of current mirror transistors.

29. A circuit according to claim 25 whereby, as a level of said modified control signal increases toward a level of said control signal, said time constant differential control signal decreases and slows a rate of change of said increasing modified control signal.

30. A circuit according to claim 29 whereby, as said increasing modified control signal level nears said control signal level, said increasing modified control signal reverts to a slow response.

* * * * *